(12) United States Patent
Lindell et al.

(10) Patent No.: US 9,910,074 B2
(45) Date of Patent: Mar. 6, 2018

(54) DIGITAL APPROACH TO THE REMOVAL OF AC PARASITICS FOR IMPEDANCE MEASUREMENTS

(71) Applicant: NATIONAL INSTRUMENTS CORPORATION, Austin, TX (US)

(72) Inventors: Blake A. Lindell, Round Rock, TX (US); Christopher G. Regier, Cedar Park, TX (US); Pablo Limon, Cedar Park, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 77 days.

(21) Appl. No.: 14/939,775

(22) Filed: Nov. 12, 2015

(65) Prior Publication Data
US 2017/0139001 A1   May 18, 2017

(51) Int. Cl.
  *G01R 31/00*   (2006.01)
  *G01R 19/00*   (2006.01)
(52) U.S. Cl.
  CPC ..... *G01R 19/0092* (2013.01); *G01R 19/0053* (2013.01); *G01R 31/00* (2013.01)
(58) Field of Classification Search
  CPC ........ G01R 23/20; G01R 27/28; G01R 27/32; G01R 31/2822; G01R 31/2837; G01R 19/0038; G01R 19/25; G01R 31/2824; G01R 31/2839; G01R 31/316; G01R 31/3167; G01R 31/31708;
  (Continued)

(56) References Cited

U.S. PATENT DOCUMENTS 4,583,223 A * 4/1986 Inoue ............... G01R 31/31917
                                              324/73.1
7,616,008 B1   11/2009 Rayman
(Continued)

OTHER PUBLICATIONS

Agilent—"Impedance Measurement Handbook: A Guide to Measurement Technology and Techniques" 4th Edition; Sep. 10, 2013; pp. 1-140; Agilent Technologies, Inc., USA (140 pages).
(Continued)

*Primary Examiner* — Vinh Nguyen
(74) *Attorney, Agent, or Firm* — Meyertons Hood Kivlin Kowert & Goetzel, P.C.; Jeffrey C. Hood

(57) ABSTRACT

An improved measurement system may include a source measure unit (SMU) capable of performing accurate low-level current measurements. Based on an SMU design that provides a controlled DC voltage source with precision current limiting and a controlled 0V (zero Volt) DC at the measurement terminal, an AC design may be implemented to establish the same (or very similar) conditions over a specified frequency range. Instead of controlling each digital-to-analog converter (DAC) at respective source terminals of the SMU as a respective DC output, each DAC may be controlled as a respective function generator with programmable frequency and continuously variable phase and amplitude. Off-the-shelf pipelined analog-to-digital converters (ADCs) may be used to monitor voltage, current and the voltage at the measurement terminal, and a Fourier transform may be used to obtain both the amplitude and relative phase measurements to be provided to respective control loops.

20 Claims, 7 Drawing Sheets

(58) Field of Classification Search
CPC ........ G01R 31/31813; G01R 31/31917; G01R 23/165; G01R 25/00; G01R 27/04; G01R 31/2825; G01R 31/40; G01R 35/007; H04L 25/022; H04L 1/0001; H04L 1/244; H04L 1/0003; H04L 1/0009; H04L 1/0026; H04L 25/0206; H04L 25/0226; H04L 5/0048; G06F 11/273; G06F 3/00; H02M 2001/0009; H02M 2001/0012; H02M 3/156; H02M 3/1588; H03L 7/20
See application file for complete search history.

(56) References Cited

U.S. PATENT DOCUMENTS

| | | | | |
|---|---|---|---|---|
| 7,903,008 B2 * | 3/2011 | Regier | ............... | G01R 31/2841 341/142 |
| 8,456,338 B2 * | 6/2013 | Regier | ............. | G01R 31/31924 341/142 |
| 8,797,025 B2 * | 8/2014 | Regier | ............... | G01R 31/2841 324/207.16 |

OTHER PUBLICATIONS

Agilent—"Agilent 4284A Precision LCR Meter—Service Manual" Jul. 2000; pp. 1-171; Agilent Technologies, Inc., Japan (171 pages).

* cited by examiner

DIGITAL APPROACH TO THE REMOVAL OF AC PARASITICS FOR IMPEDANCE MEASUREMENTS

FIELD OF THE INVENTION

The present invention relates to the field of instrumentation, and more particularly to improved removal of AC parasitics and cabling/connectivity parasitics in measurement instruments.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

Instrumentation systems are oftentimes used to perform measurements of various kinds. One type of instrumentation hardware to perform such measurements is a source measure unit, or SMU. An SMU is a special kind of instrument that can operate as a constant current source or as a constant voltage source to a pair of terminals, while simultaneously operating as a measurement instrument for measuring the current or voltage across those terminals. Typically, when an SMU is operated to source a constant voltage, it is used to measure current flowing through the terminals. Similarly, when it is operated to source a constant current through the terminals, it is used to measure the voltage developed across the terminals. SMUs can be used in automatic test equipment and may be built-in (or integrated) into a single piece of hardware, or they may include different types of interfaces (e.g. USB) for connecting to a computer or other control system. One of the most notable characteristics of an SMU is its precision when contrasted with a standard power supply. Precision, in this instance, refers to two related key features, namely sensitivity and accuracy.

Sensitivity is defined as the smallest detectable change that can be measured (or sourced) by an instrument. That is, sensitivity is the smallest increment that can be set at the output of a device or detected at the input of a device. SMUs achieve greater sensitivity than standard power supplies by offering multiple operating ranges for setting and reading voltage and current. Accuracy references the uncertainty of a given source or measurement. Absolute accuracy is referenced to a "true" reading represented by a standard. SMUs typically have accuracies for both sourcing and measuring that are at or below 0.1 percent of the output to which they are set. Together, the sensitivity and accuracy of an SMU defines its performance in a given application. While some applications can be mainly focused on detecting small changes, others focus on tight certainty of a sourced value or measured response. In general, SMUs are employed when the accuracy of sourced and measured values is important, and the application requires sensitivity beyond what can be found in a typical programmable power supply. However, the accuracy of many measurements, for example low-level current measurements, may still be adversely affected by parasitics leading to current loss.

Other corresponding issues related to the prior art will become apparent to one skilled in the art after comparing such prior art with the present invention as described herein.

SUMMARY OF THE INVENTION

Various embodiments of an improved measurement system include a source measure unit (SMU) capable of performing accurate low-level current measurements. Based on an SMU design configured to provide a controlled DC voltage source with precision current limiting and a controlled 0V (zero Volt) DC voltage at the measurement terminal relative to internal potentials, an AC design may be implemented to establish the same (or very similar) conditions over a specified frequency range. Rather than controlling each digital-to-analog converter (DAC) at respective source terminals of the SMU as a respective DC output, each DAC may be controlled as a respective function generator with programmable frequency and continuously variable phase and amplitude. In some embodiments, off-the-shelf pipelined analog-to-digital converters (ADCs) may be used to monitor voltage, current and the voltage at the measurement terminal, and a Fourier transform may provide both amplitude and relative phase measurement to be provided into respective control loops.

Accordingly, in some embodiments, a measurement circuit may include a first test terminal for coupling to a first device terminal of a device under test (DUT), and a second test terminal for coupling to a second device terminal of the DUT. The measurement circuit may further include a first control circuit and a second control circuit. The first control circuit may generate a first control signal with a respective programmable frequency and respective continuously variable phase and amplitude, and develop at least a portion of a first voltage at the first device terminal of the DUT by providing the first control signal to the first terminal. The second control circuit may generate a second control signal with a respective programmable frequency and respective continuously variable phase and amplitude, and develop at least a portion of a second voltage at the second device terminal of the DUT by providing the second control signal to a shunt element coupled to the second terminal. The respective phase and amplitude of the first control signal and the respective phase and amplitude of the second control signal may be adjustable to cause the second voltage to remain at a specified value that is within a specified range of a nominal value. The second voltage may be DC voltage and/or an AC voltage. In one set of embodiments, the first control circuit and the second control circuit both include digital-to-analog converters.

The measurement circuit may also include two control loops. The first control loop may operate to adjust the respective phase and amplitude of the first control signal at least according to first measurement values corresponding to the respective phase and amplitude of the first control signal, while the second control loop may operate to adjust the respective phase and amplitude of the second control signal at least according to second measurement values corresponding to the respective phase and amplitude of the second control signal. In some embodiments, the first measurement values are obtained through a Fourier transform from first measurements of the respective phase and amplitude of the first control signal, and the second measurement values are obtained through the Fourier transform from second measurements of the respective phase and amplitude of the second control signal. The voltage developed across the shunt element may be monitored through sense circuitry, whereby the shunt element may be a known impedance (whether resistive, capacitive, and/or inductive or any combination thereof).

In one set of embodiments, accurate low-level current measurements may be performed by developing at least a portion of a first voltage at a first device terminal of a DUT, which includes driving a first control signal with respective programmable frequency and continuously variable phase and amplitude at the first device terminal, while also developing at least a portion of a second voltage at a second device terminal of the DUT, which includes driving a second control signal with respective programmable frequency and continuously variable phase and amplitude at a shunt element coupled to the second terminal of the DUT. Part of performing the measurement also includes causing the second voltage to remain at a specified value that is within a specified percentage of a nominal value, which includes adjusting the respective phase and amplitude of the first control signal and the respective phase and amplitude of the second control signal. The first control signal may be generated using a first digital-to-analog controller, and the second control signal may be generated using a second digital-to-analog controller. Furthermore, the respective phase and amplitude of the first control signal may be adjusted through a first control loop at least according to first measurement values corresponding to the respective phase and amplitude of the first control signal, and the respective phase and amplitude of the second control signal may be adjusted through a second control loop at least according to second measurement values corresponding to the respective phase and amplitude of the second control signal.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
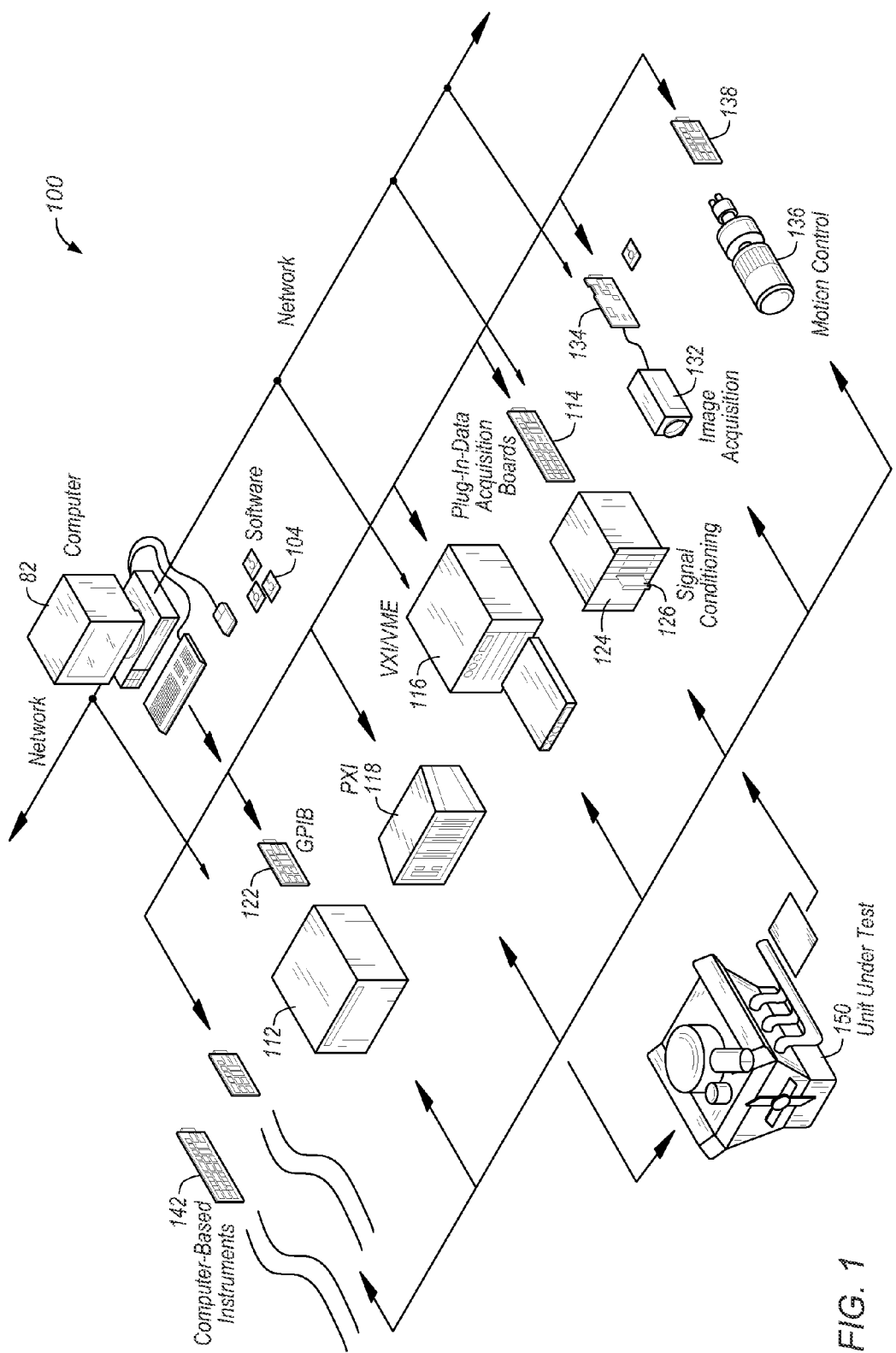
FIG. 1 shows an instrumentation control system with instruments networked together according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Embodiments of improved source measure units (SMUs) and/or measurement circuits described herein may be used in systems configured to perform test and/or measurement functions, to control and/or model instrumentation or industrial automation hardware, or to model and simulate functions, e.g., modeling or simulating a device or product being developed or tested, etc. More specifically, they may be used in various instances where accurate measurements are required, and more specifically, where accurate low-level current measurements may be required. However, it is noted that various embodiments may equally be used for a variety of applications, and such applications are not intended to be limited to those enumerated above. In other words, applications discussed in the present description are exemplary only, and various embodiments of improved source measure units (SMUs) with increased measurement accuracy may be used in any of various types of systems.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
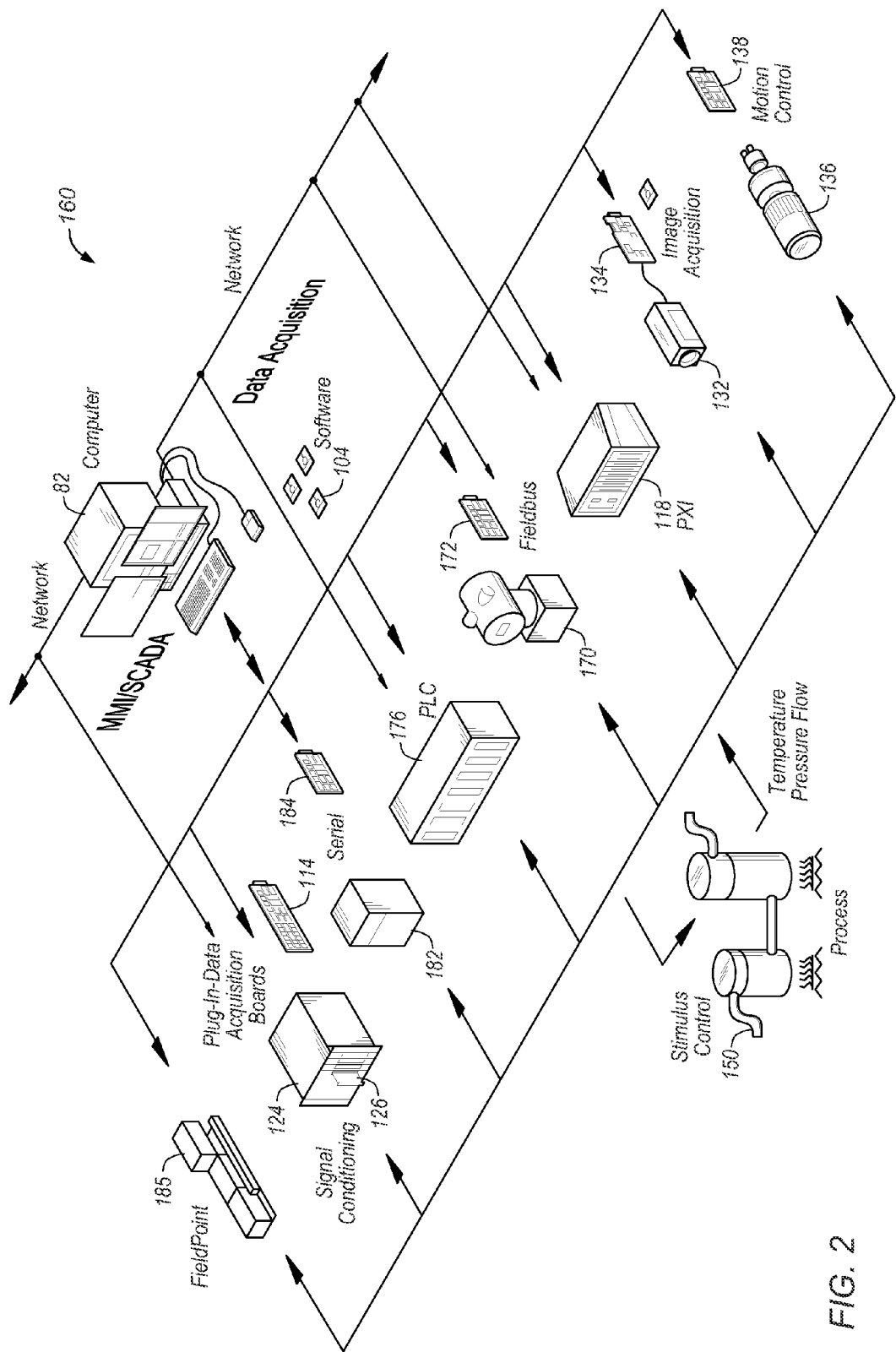
FIG. 2 shows an industrial automation system with instruments networked together according to one embodiment of the invention.

FIG. 2 illustrates an exemplary industrial automation system 160 that may be configured according to embodiments of the present invention. Industrial automation system 160 may be similar to instrumentation or test and measurement system 100 shown in FIG. 2. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Performing Accurate Measurements

Figure 3:
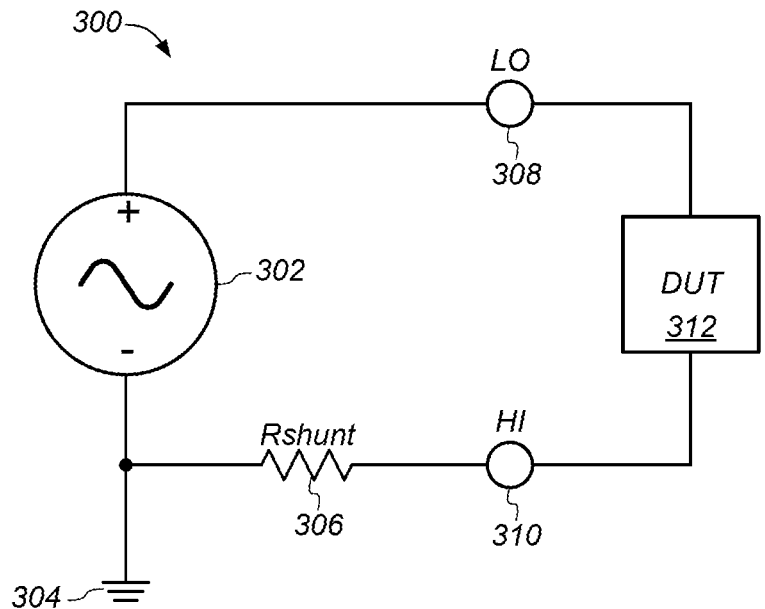
FIG. 3 shows a circuit diagram of an exemplary measurement circuit, according to prior art.

One or more of the devices and instruments shown in FIGS. 1 and 2 may include circuitry or a combination of circuitry and programming instructions executable to perform impedance measurements. FIG. 3 shows an exemplary system 300 for performing inexpensive measurement of a complex impedance using an SMU. System 300 may be used to measure an unknown impedance, for example the impedance of a device under test (DUT) 312, the impedance noted as Zdut. To perform the measurement, a voltage source 302 is used to generate a voltage sine wave across the DUT 312 which is coupled across terminals 308 and 310. A current sensing element 306, in this example a shunt resistor, is inserted in the signal path between terminal 310 (also referenced herein as the "measurement terminal") and a voltage reference 304, e.g. voltage ground 304. The resulting AC voltage is proportional to the AC current known to be flowing through the DUT 312. A Fourier conversion and comparison of the measured voltage across DUT 312 and the current flowing through DUT 312 provides an impedance measurement at the given test signal frequency. This measurement method is referred to as the "I-V" method for measuring an unknown impedance.

Figure 4:
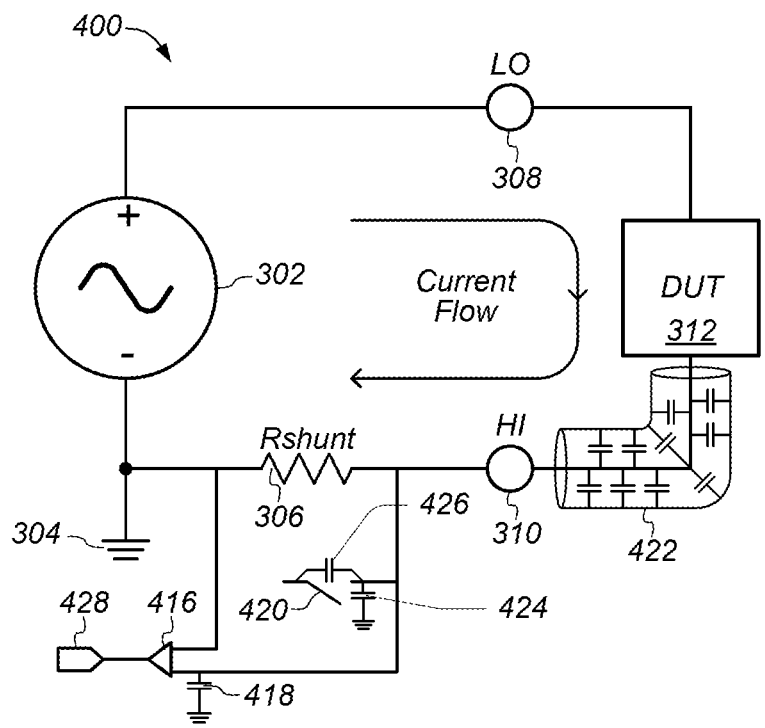
FIG. 4 shows a more detailed circuit diagram of the exemplary measurement circuit of FIG. 3, illustrating parasitics, according to prior art.

FIG. 4 shows an exemplary system 400 for performing inexpensive measurement of a complex impedance using an SMU. In essence, system 400 illustrates various parasitics (in this instance parasitic capacitances) that may affect the current measurements performed using current sense circuit 416, ADC 428, and front end switches such as that represented by 420. As shown in FIG. 4, current sense circuit (e.g. a current sense amplifier) 416 is coupled across shunt resistor Rshunt 306 to obtain a measured voltage across resistor 306, indicative of the current flowing through resistor 306, and therefore ideally also flowing through DUT 312. However, during measurements, especially when performing low level current measurements, various parasitics may result in current leakage, or current loss between DUT 312 and resistor 306, as well as in various parts of the measurement circuit (including components 416, 420, and 426 and their connecting elements), affecting the accuracy of any value obtained for the current flowing through DUT 312, since what is actually measured is the current flowing through resistor 306. Because the intent is to measure the current flowing through DUT 312, current losses that occur on the LO terminal 308 side of DUT 312 do not affect measurement accuracy. Current losses on the HI terminal 310 side of DUT 312, on the other hand, lead to measurement inaccuracies.

As mentioned above, the addition of the necessary measurement hardware plus consideration of the test cabling may result in significant parasitics, which may in turn lead to current losses. More specifically, the current losses of interest may include cable leakage (especially between the HI terminal 310 and DUT 312), front-end switch leakage at front-end switches such as that represented by 420, and front-end input bias leakage at current sense circuit 416. To minimize cable leakage, a cable shield 422 may be provided around the cable section between DUT 312 and HI terminal 310. However, any such shield may itself be subject to parasitics. FIG. 4 illustrates the parasitic capacitance between HI terminal 310 and the cable shield (422), the measurement hardware power supplies/ground (418), and the other side of Rshunt/ground (424, 426). Exemplary values for some typical values for these parasitic capacitances include ~30 pF/foot for the cable shield (422), 100's-1000's pF range for the front-end switching (424, 426), and 10's-100's pF range for the measurement circuitry (418). These parasitic capacitances allow current to bypass the current sense element, Rshunt 3006, which at high frequencies may have significantly higher impedance than the parallel sum of the parasitic capacitance. Any current that bypasses the shunt resistor 306 may result in measurement error. It is therefore desirable to minimize both the absolute voltage at the HI terminal 310 and the change of voltage at the HI terminal 310 with respect to the voltages of the parasitic elements in order to remove most of the parasitic capacitance from consideration.

Shunt Driver Based Measurement Circuit

Figure 5:
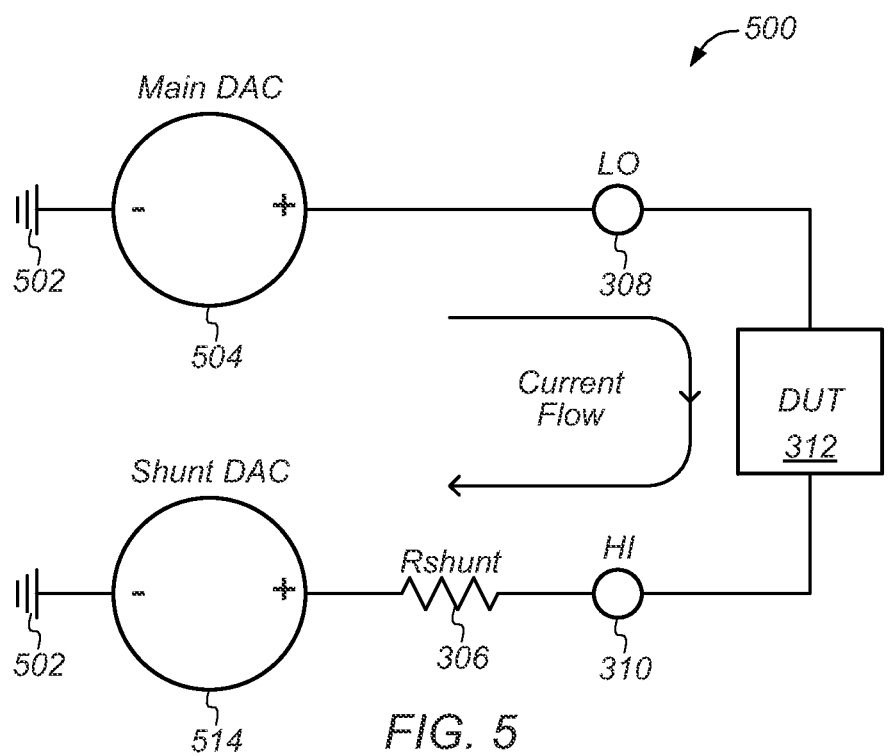
FIG. 5 shows a circuit diagram of an exemplary measurement circuit operating with digital to analog converters, according to prior art.

For extreme low-current measurements, all of the above referenced parasitics may be considered to have a DC leakage equivalent, such as cable leakage (e.g. relating to 422), leakage through turned-off current range switches (e.g. relating to 424, 426), and operational amplifier input bias currents (e.g. relating to 418). A prototype circuit has been developed in which a DAC is used to drive the low side of the shunt, rather than connecting it to the circuit ground, and a DAC output voltage is selected/specified such that the voltage at the HI terminal 310 is always ~0V. This minimizes the parasitic DC leakage, and/or holds it somewhat constant over the entire current range. This is illustrated in circuit/system 500 shown in FIG. 5. As seen in FIG. 5, a Main DAC 504 is used to drive the LO terminal 308, while a Shunt DAC 514 is used to drive the low side of shunt resistor 306 (on the HI terminal 310 side of DUT 312). That is, a first terminal (high side) of resistor 306 is coupled to HI terminal 310, while a second terminal (low side) of resistor 306 is coupled to and driven by Shunt DAC 514. As shown, DACs 504 and 514 are both referenced to ground 504. The output voltage of Shunt DAC 514 may be selected/generated such that the voltage at HI terminal 310 is 0V.

However, a standard control loop, such as a control loop that includes an inverting amplifier driving the low side terminal (or second terminal, coupled to Shunt DAC 514) of Rshunt 306 to keep the HI terminal 310 at 0V (or at a voltage of negligible value), or virtual ground, may be insufficient, since in the process of holding virtual ground the control loop may cause Rshunt 306 to effectively disappear from the main control loop. The existence of a linear, non-zero Rshunt 306 is important to SMU architectures which employ a voltage output that also allows for precision current limiting. To overcome such limitation, the main output loop may be considered as having control over a combination of Main DAC 504 and Shunt DAC 514, specifically a value commensurate with a difference of the output driving value of Main DAC 504 and Shunt DAC 514 (i.e. Main DAC− Shunt DAC, or Main DAC "minus" Shunt DAC). This quantity or difference may be held stable over changes in the output value of Shunt DAC 514 by making fast nullifying adjustments in the Main DAC 504. Implementing such control allows the main output loop to still experience the effects of Rshunt 306 while also controlling the voltage at HI terminal 310 to be (approximately) 0V, or the very least, a value that is within a specified maximum delta value, or difference value of 0V, or within a specified range of 0V, which may generally be referenced as a negligible voltage, or voltage having a negligible value. One example of such a control scheme is illustrated in the system/circuit 600 of FIG. 6, according to some embodiments. As indicated, a combination DAC circuit 602 includes Main DAC 504 and Shunt DAC 514 coupled to obtain a value driving the low side (second) terminal of shunt resistor 306, where changes in output of Shunt DAC 514 may be offset or nullified by commensurate adjustments made in Main DAC 504 to maintain a stable driving value at the low side terminal of Rshunt 306.

Auto-Balance Bridge

Figure 7:
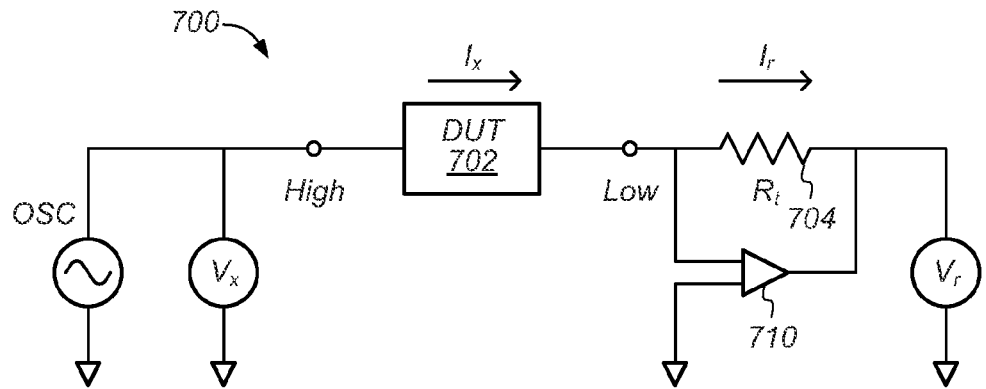
FIG. 7 shows a circuit diagram of an exemplary auto-balance bridge based measurement circuit, according to prior art.
Figure 8:
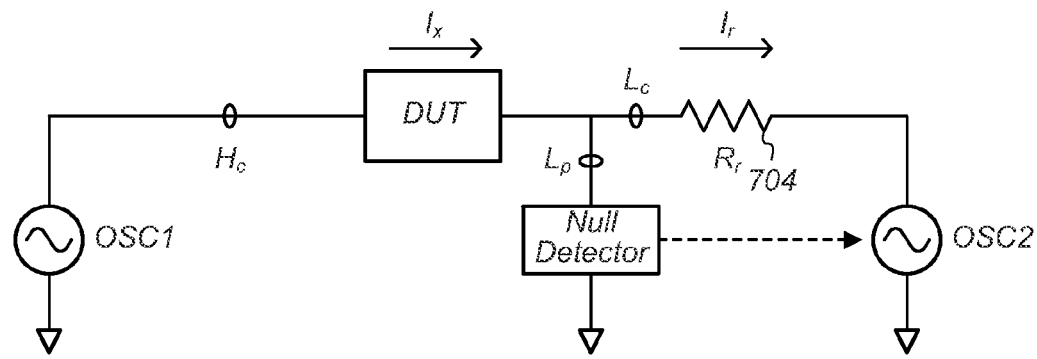
FIG. 8 shows a circuit diagram illustrating operation of the auto-balanced bridge of FIG. 7, according to prior art.
Figure 9:
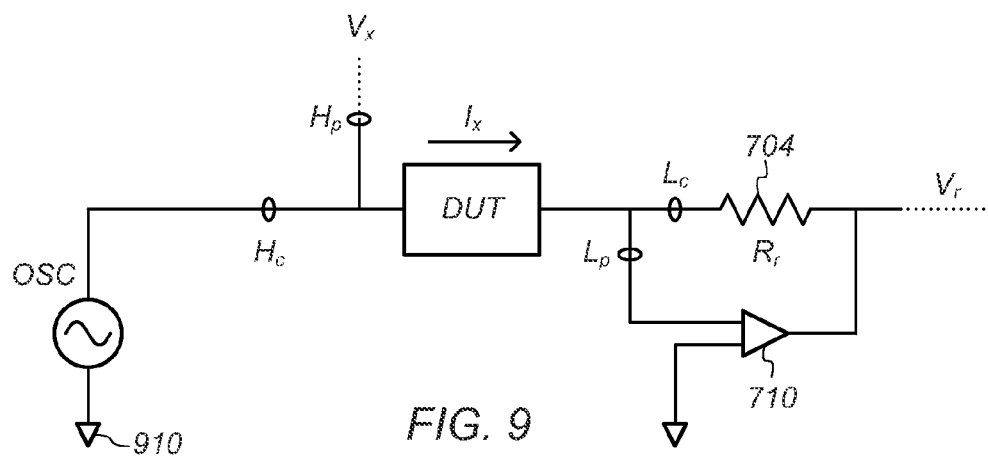
FIG. 9 shows a circuit diagram of an exemplary auto-balancing bridge for frequencies below 100 kHz, according to prior art.
Figure 10:
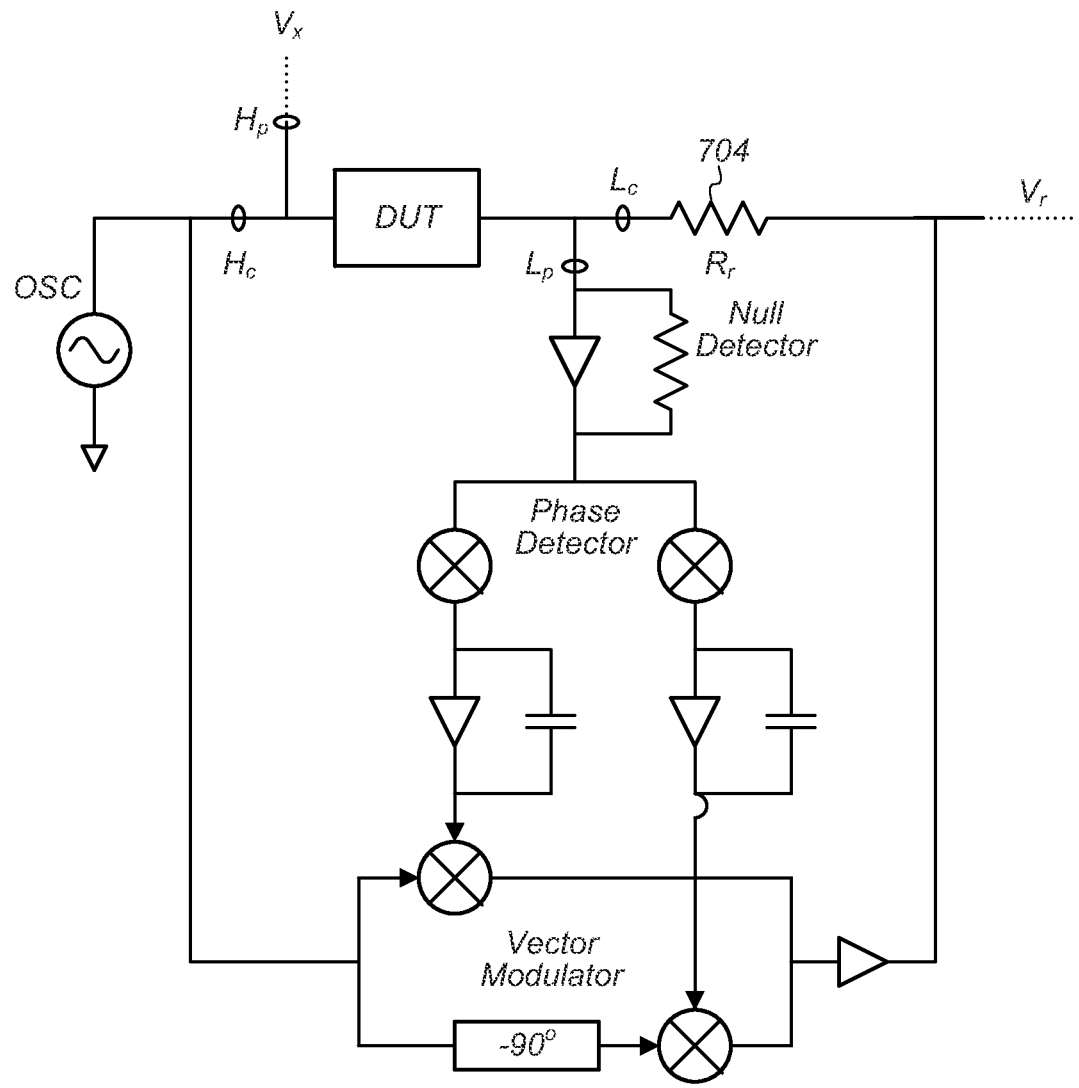
FIG. 10 shows a circuit diagram of an exemplary auto-balancing bridge for frequencies above 100 kHz, according to prior art.

In order to minimize a terminal voltage for the reduction of parasitics, many high-end LCR (inductance/capacitance/resistance) meters use a technique known as an "Auto-Balance" bridge. One exemplary simplified arrangement of such a circuit 700 is shown in FIG. 7. The circuit configuration shown in FIG. 7 includes an inverting operational amplifier 710 creating a virtual-ground similar to the DC method, which was described above (with respect to FIG. 5) as being insufficient when precision current limiting is required due to the effective removal of the shunt resistor, indicated as resistor 704 in FIG. 7. When using an LCR meter as opposed to an SMU, current control may not be required, therefore, in theory, it may be considered a satisfactory solution. However, the drive circuitry becomes significantly more complex for higher frequencies, where a simple operational amplifier would not have a sufficient loop gain required for proper control. A second, locked VCO (voltage controlled oscillator) phase may be developed by mixing phases of the original oscillator, as shown in FIG. 8 which illustrates operation of the auto-balancing bridge. As observed in at least FIG. 8, the auto-bridge methodology easily leads to analog complexities and expenses. FIG. 9 illustrates an exemplary auto-balancing bridge circuit for frequencies below 100 kHz, and FIG. 10 illustrates exemplary auto-balancing bridge circuit for frequencies above 100 kHz. As mentioned above, the complexity for higher frequencies renders this an unsatisfactory solution.

AC Equivalent Shunt Driver Based Measurement Circuit

Figure 6:
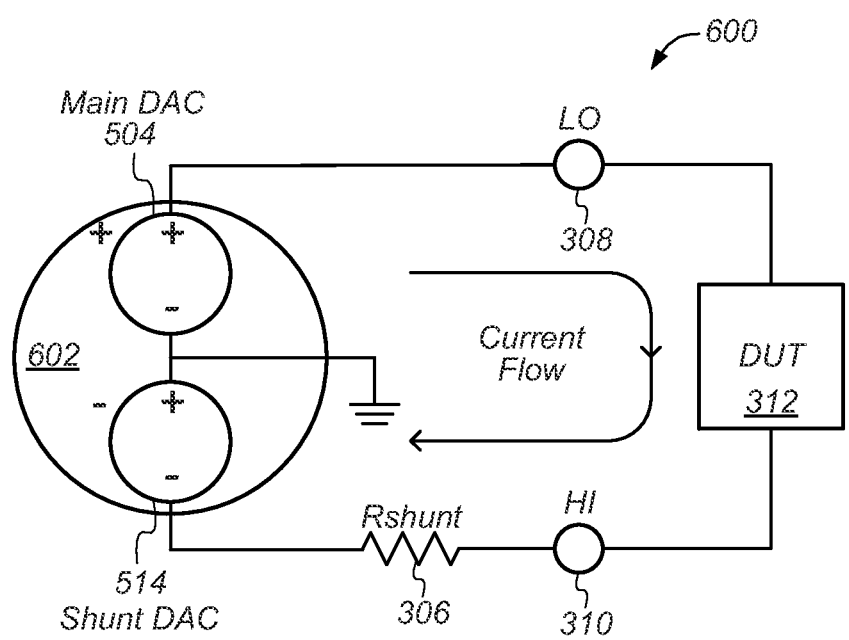
FIG. 6 shows a circuit diagram of an exemplary improved measurement circuit, according to some embodiments.
Figure 11:
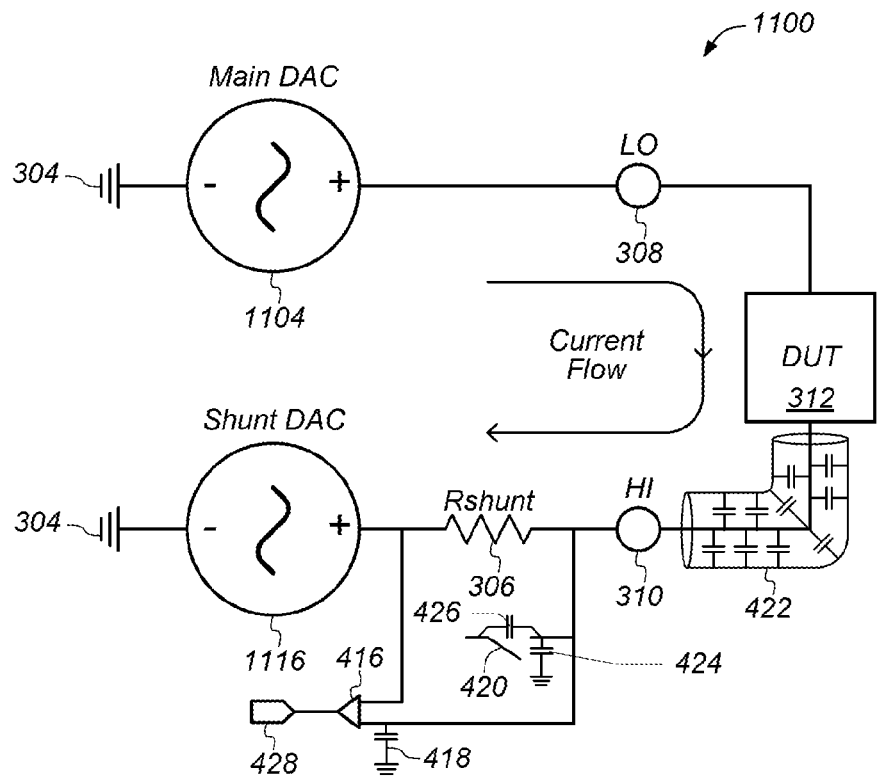
FIG. 11 shows a circuit diagram of an exemplary improved measurement circuit operating with two digital to analog converters, according to some embodiments.

In some embodiments, a more accurate measurement solution includes an improved, modified AC version of the shunt driver based measurement circuits shown in FIGS. 5 and 6, especially the circuit shown in FIG. 6. One exemplary circuit 1100 is shown in FIG. 11. While the design shown in, for example, FIG. 6 provides a controlled DC voltage source with precision current limiting and a controlled 0V DC at the HI terminal 310, the AC design 1100 provides such control over a specified frequency range and at individually specified frequencies. Rather than controlling Main DAC 1104 and Shunt DAC 1116 as respective DC outputs, they may each be controlled as a respective multi-function generator (FGEN) having programmable frequencies and continuously variable phases and amplitudes. More generally, a first control circuit including DAC 1104 and a second control circuit including DAC 1116 may each have programmable frequencies and continuously variable phases and amplitudes, and may be operated as will be further described below with respect to FIG. 11 and also FIG. 12. In some embodiments, off-the-shelf pipelined ADCs may be used to monitor voltage, current and the voltage at HI terminal 310. A Fourier transform may be used to provide both amplitude and relative phase measurements to the respective control loops of Main DAC 1104 and Shunt DAC 1116, which are shown in more detail in FIG. 12 and will be further discussed below. The frequency of each control circuit (which respectively include DAC 1104 and DAC 1116) may be programmable, and the phase and amplitude of each control circuit may be controlled through a respective control loop, for which amplitude and phase measurement values used for control purposes may be provided through the aid of a Fourier transform. The control loop logic or logic circuitry may be part of DACs 1104 and 1116, or may be part of additional circuitry not explicitly shown in FIG. 11 but shown in FIG. 12, or may be included in a combination thereof.

The control circuits that include DACs 1104 and 1116 may be operated such that the voltage at HI terminal 310 remains at or near 0V DC and AC (at the specified frequencies). More generally, as previously mentioned above, the control circuits that include DACs 1104 and 1116 may be operated to keep the DC voltage and AC voltage at the HI terminal 310 at a negligible value, or a value within a specified range of 0V, or within a range that includes 0V. The loop gain may be determined (or limited) only by the specified minimum resolution at which measurements of the error signal are made, without forfeiting the instrument's ability to provide precision current limiting and SMU capabilities. The circuit 1100 may equally be operated in a DC mode of operation similar to the operation of circuit 600, for example, whereby the voltage a the HI terminal 310 may be held at 0V DC, providing similar DC leakage benefits as described above with respect to FIG. 5 and FIG. 6. It should be noted that holding the voltage at HI terminal 310 to 0V AC and/or 0V DC may include holding the voltage at or near 0V or at/near a negligible value in each case, or more generally holding the voltage at HI terminal 310 to a value that does not deviate from a nominal value of 0V by more than a specified value. In other words, while in some embodiments the voltage at HI terminal 310 may be held at exactly 0V (AC or DC), in other embodiments the voltage at HI terminal 310 may be successfully held at a value within a specified range (plus or minus) inclusive of 0V. Overall, the voltage at HI terminal 310 may be held at a value considered negligible with respect to obtaining an accurate measurement, whereby a measurement of the current flowing through shunt element 306 provides an accurate representation of the current flowing through DUT 312. It should also be noted that in some embodiments, measurement circuit 1100 may include additional terminals for controlling voltage at DUT 312 without requiring cable drops.

Figure 12:
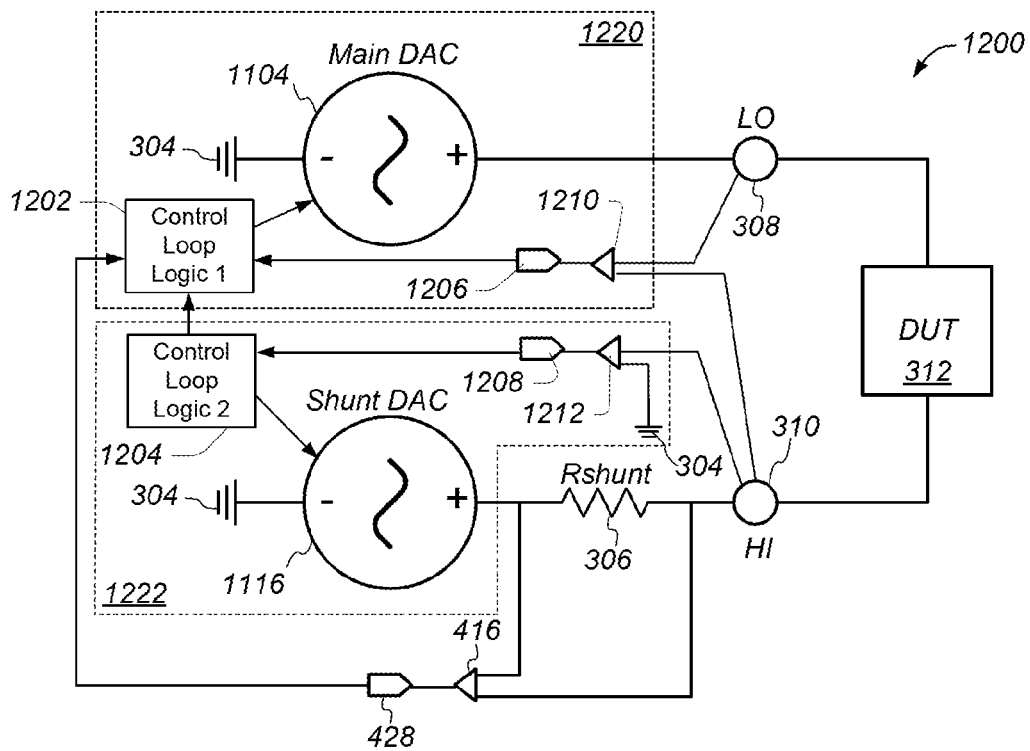
FIG. 12 shows a more detailed circuit diagram of an exemplary improved measurement circuit operating with two analog to digital converters, according to some embodiments.

FIG. 12 shows a more detailed circuit diagram of an exemplary measurement circuit 1200, which is based on circuit 1100 shown in FIG. 11. For clarity and simplicity, only the primary circuit elements and logic circuitry are shown in FIG. 12, omitting for example the parasitics shown in FIG. 11, and also omitting parasitics that may be present due to the inclusion of at least additional components 1206 and 1208, for example. As shown in FIG. 12, a first control circuit 1220 includes DAC 1104 and a second control circuit 1222 includes DAC 1116. Control circuits 1220 and 1222 may each have programmable frequencies and continuously variable phases and amplitudes. Sense circuit 1210 and ADC 1206 are included to monitor voltage across DUT 312, i.e. the voltage across HI terminal 310 and LO terminal 308. Sense circuit 1212 and ADC 1208 are included to monitor the voltage at HI terminal 310, i.e. across HI terminal 310 and signal ground (such as ground 301). Finally, as also shown in circuit 1100, ADC 428 and sense circuit 416 are included to monitor the voltage across shunt element 306. In some embodiments, control circuit 1220 and 1222 may each include a number of different components such as ADCs, DACs, control circuitry and/or one or more additional processing elements performing various signal processing functions and/or mathematical operations. It should be noted here that as used herein, the term "processing element" refers to various elements or combinations of elements that include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors.

Control circuit 1220 includes control loop logic circuitry 1202 while control circuitry 1222 includes control loop logic circuitry 1204. This creates a first control loop from DUT terminals 308 and 310 to the first control circuit 1220, and also creates a second control loop from DUT terminal 310 to control circuit 1222. Thus, control loop logic 1202 may control DAC 1104 to generate the first control signal applied at LO terminal 308 based at least in part on the monitored voltage across the terminals of DUT 312. Control loop logic 1202 may control DAC 1104 further based on the monitored voltage across shunt element 306, which, for a known impedance value provides an indication of the current flowing through DUT 312. Similarly, control loop logic 1204 may control DAC 1116 to generate the second control signal applied at the HI terminal 310 based at least in part of the monitored voltage at HI terminal 301, i.e. between HI terminal 310 and ground. Finally, control loop logic 1202 may also control DAC 1104 based on feedback received from control loop logic circuit 1204, that is, based on the control value(s) used by control loop logic 1204 to control DAC 1116. In other words, the first control signal provided to terminal 308 may in addition be controlled according to (or based on) the second control signal provided to terminal 310.

Thus, in some embodiments, the control value(s) generated by control loop logic circuit 1204 may be subtracted from the control value(s) generated by control loop logic circuit 1202 prior to providing the respective control values to DAC 1104 and DAC 1116 for generating the two respective control signals (provided, respectively, by DACs 1104 and 1116), thus maintaining a constant sum total of the respective control values provided to DACs 1104 and 1116. Control loop logic circuits 1202 and 1204 may each generate Fourier transforms used to obtain both amplitude and relative phase measurements for the respective control loops. The frequencies of the respective control signals generated by control circuit 1202 and control circuit 1204 may be programmable, and the phase and amplitude of each control signal may be controlled through its respective control loop, for which amplitude and phase measurement values used for control purposes may be provided through the aid of the Fourier transform, as mentioned above. It should also be noted that in some embodiments, for example when it is desirable to account for signal propagation delays in the cabling or electrical connections between the various components included in the respective control loops, the polar magnitude/phase representation of the measurements may be substituted with vector magnitude representation (i.e. real/imaginary number representation) of the measurements instead. In some embodiments, control loop logic circuitry 1202 may actually be part of DAC 1104 and/or control loop logic circuitry 1204 may actually be part of DAC 1116, or they may implemented as separate circuitry as shown, or may be included in a combination thereof. For example, in some embodiments, control loop logic circuit 1202 and control loop logic circuit 1204 may both be part of a single control circuit separate from DACs 1104 and 1116.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A measurement circuit comprising:
   a first test terminal configured to couple to a first device terminal of a device under test (DUT);
   a second test terminal configured to couple to a second device terminal of the DUT;
   a first control circuit configured to generate a first control signal with a respective programmable frequency and respective continuously variable phase and amplitude, and configured to develop at least a portion of a first voltage at the first device terminal of the DUT by providing the first control signal to the first terminal; and
   a second control circuit configured to generate a second control signal with a respective programmable frequency and respective continuously variable phase and amplitude, and configured to develop at least a portion of a second voltage at the second device terminal of the DUT by providing the second control signal to a shunt element coupled to the second terminal;
   wherein the respective phase and amplitude of the first control signal and the respective phase and amplitude of the second control signal are adjustable to cause the second voltage to remain at a specified value that is within a specified range inclusive of a nominal value.

2. The measurement circuit of claim 1, wherein the second voltage is one or more of the following:
   a DC voltage; or
   an AC voltage.

3. The measurement circuit of claim 1, wherein the first control circuit and the second control circuit both comprise digital-to-analog converters.

4. The measurement circuit of claim 1, further comprising:
   a first control loop configured to adjust the respective phase and amplitude of the first control signal at least according to first measurement values corresponding to the respective phase and amplitude of the first control signal; and
   a second control loop configured to adjust the respective phase and amplitude of the second control signal at least according to second measurement values corresponding to the respective phase and amplitude of the second control signal.

5. The measurement circuit of claim 4, wherein the first measurement values are obtained through a Fourier transform from first measurements of the respective phase and amplitude of the first control signal; and
   wherein the second measurement values are obtained through the Fourier transform from second measurements of the respective phase and amplitude of the second control signal.

6. The measurement circuit of claim 1, further comprising:
   sense circuitry configured to monitor voltage developed across the shunt element.

7. The measurement circuit of claim 6, wherein the shunt element is an impedance of specified value.

8. A method for performing accurate low-level current measurements, the method comprising:
   developing at least a portion of a first voltage at a first device terminal of a device under test (DUT), comprising driving a first control signal with respective programmable frequency and continuously variable phase and amplitude at the first device terminal;
   developing at least a portion of a second voltage at a second device terminal of the DUT, comprising driving a second control signal with respective programmable frequency and continuously variable phase and amplitude at a shunt element coupled to the second terminal of the DUT;
   causing the second voltage to remain at a specified value that is within a specified range inclusive of a nominal value, comprising adjusting the respective phase and amplitude of the first control signal and the respective phase and amplitude of the second control signal.

9. The method of claim 8, wherein the second voltage is one or more of the following:
   a DC voltage; or
   an AC voltage.

10. The method of claim 8, further comprising:
    generating the first control signal using a first digital-to-analog controller; and
    generating the second control signal using a second digital-to-analog controller.

11. The method of claim 8, further comprising:
    adjusting the respective phase and amplitude of the first control signal through a first control loop at least according to first measurement values corresponding to the respective phase and amplitude of the first control signal; and
    adjusting the respective phase and amplitude of the second control signal through a second control loop at least according to second measurement values corresponding to the respective phase and amplitude of the second control signal.

12. The method of claim 11, further comprising:
    obtaining the first measurement values through a Fourier transform from first measurements of the respective phase and amplitude of the first control signal; and
    obtaining the second measurement values through the Fourier transform from second measurements of the respective phase and amplitude of the second control signal.

13. The method of claim 8, further comprising:
    sensing a voltage developed across the shunt element.

14. The method of claim 13, wherein the shunt element is an impedance of specified value.

15. A measurement system comprising:
    a device under test (DUT) having a first device terminal and a second device terminal; and
    a measurement circuit comprising:
       a first control circuit configured to generate a first control signal with a respective programmable frequency and respective continuously variable phase and amplitude, and configured to develop at least a portion of a first voltage at the first device terminal by providing the first control signal to the first device terminal; and
       a second control circuit configured to generate a second control signal with a respective programmable frequency and respective continuously variable phase and amplitude, and configured to develop at least a portion of a second voltage at the second device terminal by providing the second control signal to a shunt element coupled to the second device terminal;
    wherein the respective phase and amplitude of the first control signal and the respective phase and amplitude of the second control signal are adjustable to cause the second voltage to remain at a specified value that is within a specified range inclusive of a nominal value.

16. The measurement system of claim 15, wherein the nominal value is zero volts.

17. The measurement system of claim 15, wherein the first control circuit is further configured to:
  receive feedback from the second control circuit, wherein the feedback provides information about adjustments made to the second control signal; and
  adjust the first control signal based at least on the received feedback.

18. The measurement system of claim 15, wherein the first control circuit and the second control circuit both contain digital-to-analog converters.

19. The measurement system of claim 15, wherein the measurement circuit further comprises:
  a sense element coupled across the shunt element and configured to sense a voltage developed across the shunt element; and
  an analog-to-digital convert configured to provide a digital value representative of the sensed voltage.

20. The measurement system of claim 15, wherein the measurement circuit further comprises:
  a first control loop configured to adjust the respective phase and amplitude of the first control signal at least according to first measurement values corresponding to the respective phase and amplitude of the first control signal; and
  a second control loop configured to adjust the respective phase and amplitude of the second control signal at least according to second measurement values corresponding to the respective phase and amplitude of the second control signal;
  wherein the first measurement values are obtained through a Fourier transform from first measurements of the respective phase and amplitude of the first control signal; and
  wherein the second measurement values are obtained through the Fourier transform from second measurements of the respective phase and amplitude of the second control signal.

\* \* \* \* \*